United States Patent [19]

Sawano et al.

[11] 3,789,275

[45] Jan. 29, 1974

[54] ALTERNATOR RECTIFIER ASSEMBLIES WITH RESINOUS MOLDED MEMBER CONTAINING CIRCUIT PATTERN MOLDED THEREIN

[75] Inventors: Takahiro Sawano, Kawasaki; Katuhiko Kubota, Yokohama; Masaru Ando, Kawasaki; Moriyasu Wada, Naka; Tohru Murayama, Kawaguchi; Tadayuki Ozawa, Tokyo, all of Japan

[73] Assignee: Tokyo Shibaura Electric Co., Ltd., Saiwai-ku, Kawasaki-shi, Japan

[22] Filed: Sept. 27, 1972

[21] Appl. No.: 292,544

[30] Foreign Application Priority Data

Sept. 30, 1971 Japan ............................... 46-89451

[52] U.S. Cl. ...... 317/234 R, 317/234 A, 317/234 E, 317/234 W, 320/8 C, 321/8

[51] Int. Cl. ........................ H01l 3/00, H01l 5/00

[58] Field of Search...317/234 A, 234 G, 234 W, 234 E, 317/234 H; 321/8; 320/8 C; 310/68 D

[56] References Cited

UNITED STATES PATENTS

| | | | |
|---|---|---|---|
| 3,396,313 | 8/1968 | Payne | 317/101 CC |
| 3,444,309 | 5/1969 | Dunn | 174/52 PE |
| 3,654,695 | 4/1972 | Delgaudio | 174/52 PE |
| 3,729,573 | 4/1973 | Dunn | 174/15 R |
| 3,486,083 | 12/1969 | Takada | 317/234 W |
| 3,602,793 | 8/1971 | Grozinger | 317/234 H |
| 3,641,374 | 2/1972 | Sato | 317/234 A |
| 3,648,121 | 3/1972 | Suenaga et al. | 317/234 G |
| 3,665,287 | 3/1970 | Cross et al. | 317/234 G |

*Primary Examiner*—Andrew J. James
*Attorney, Agent, or Firm*—Flynn & Frishauf

[57] ABSTRACT

In a semiconductor rectifier assembly of the type wherein lead wires of rectifier elements are electrically connected to a circuit pattern of an insulative substrate there are provided an annular substrate of resinous moulded member containing a conductive sheet with a circuit pattern, a pair of sector shaped plate electrodes secured to the legs of the substrate, and a plurality of semiconductor rectifier elements. One of the electrodes of the rectifier elements is connected to the plate electrode and the other electrode is connected to the circuit pattern through a lead wire extending through the substrate.

17 Claims, 12 Drawing Figures

FIG. 1
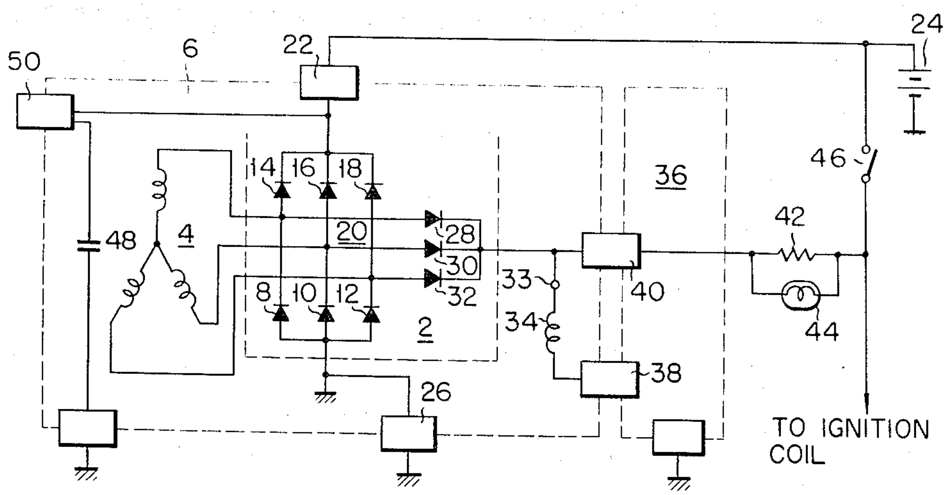
FIG. 2 FIG. 3
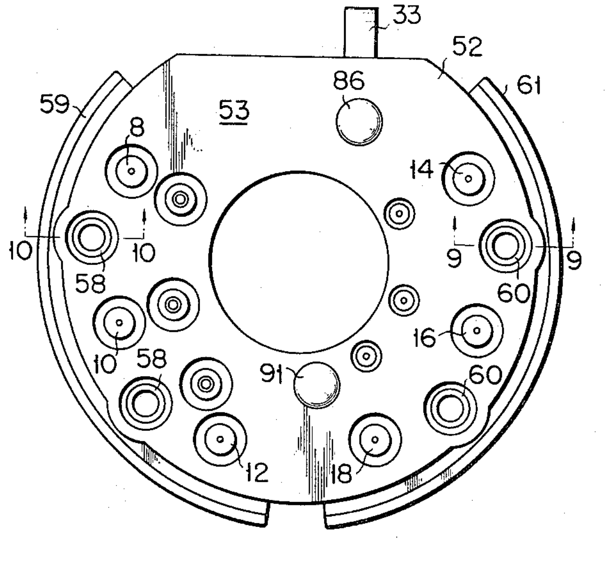
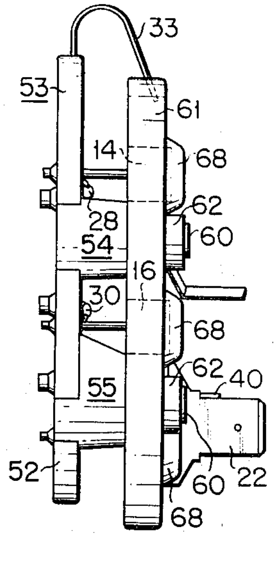

ALTERNATOR RECTIFIER ASSEMBLIES WITH RESINOUS MOLDED MEMBER CONTAINING CIRCUIT PATTERN MOLDED THEREIN

This invention relates to a semiconductor rectifier assembly including rectifier elements rigidly connected thereto and which is suitable to be incorporated in an alternator mounted on a support subjected to severe vibrations, such as motor cars.

Typical application of an alternator subjected to severe vibrations involves motor cars, and such alternator is equipped with a rectifier assembly for charging a battery. Typically, such a rectifier assembly comprises a bridge rectifier circuit in which a plurality of semiconductor rectifier elements secured on a substrate are connected into a bridge configuration by means of lead wires. However, in the prior art rectifier assembly, since the lead wires soldered to the rectifier elements are floated on the substrate, the soldered joints of the lead wires are often broken due to severe vibrations caused by the running of the motor car. Where the lead wires are made of relatively stiff material, the rectifier elements will vibrate relative to the lead wires thus peeling off the rectifier elements from the substrate. Moreover, as the lead wires are not securely fastened to the substrate there is a danger of mutual contact or short circuiting of the lead wires. Further, the prior art rectifier assembly is bulky and requires complicated assembling operation.

Accordingly, it is an object of this invention to provide an improved semiconductor rectifier assembly wherein the electrode connections are firmly supported so that they can resist severe vibrations.

Another object of this invention is to provide an improved compact semiconductor rectifier assembly which is easy to assemble and has excellent heat resistant and moisture resistant properties.

SUMMARY OF THE INVENTION

In accordance with this invention there is provided a semiconductor rectifier assembly of the type wherein electrodes such as lead wires of a plurality of rectifier elements are electrically connected to a circuit pattern of an insulative substrate, characterized in that there are provided an annular substrate including a resinous moulded member, a conductive sheet formed with a circuit pattern and moulded entirely wherein the moulded member and a plurality of legs integrally formed with the moulded member on one surface thereof; a pair of sector shaped plate electrodes secured to said legs; and a plurality of semiconductor rectifier elements, each having a first electrode and a second electrode, the first electrodes thereof being directly and electrically connected to the plate electrodes and the second electrodes thereof extending through the substrate and connected to the circuit pattern.

The invention can be more fully understood from the following detailed description taken in conjunction with the accompanying drawings, in which:

FIG. 1 is a electrical connection diagram of one embodiment of the semiconductor rectifier assembly incorporated into an alternator mounted on a motor car;

FIG. 2 shows a plan view of one embodiment of the semi-conductor rectifier assembly constructed according to the teaching of the invention;

FIG. 3 is a side view of the assembly shown in FIG. 2;

Figure 4:
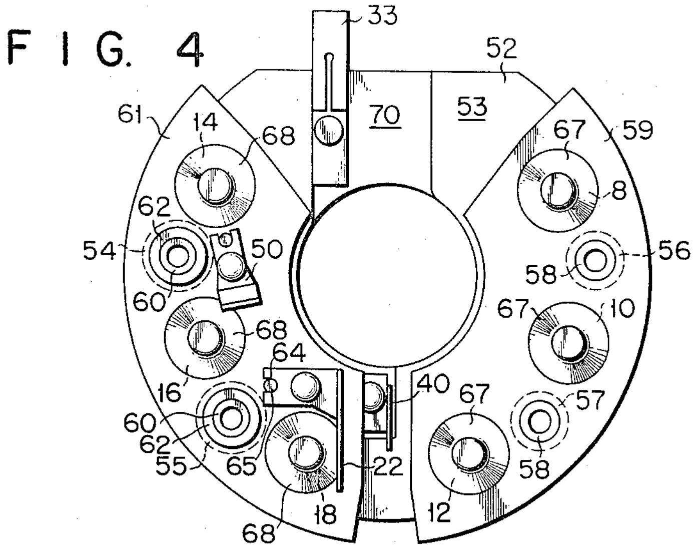
FIG. 4 is a bottom view of the assembly shown in FIG. 2.

The semiconductor rectifier assembly 2 diagrammatically shown in FIG. 1 is adapted to be mounted in a casing 6 of an alternator 4 for use in a motor car, for example. The rectifier assembly comprises six rectifier elements 8, 10, 12, 14, 16 and 18 which are connected in a three-phase bridge rectifier circuit 20. The positive output terminal 22 of the rectifier circuit 20 is connected to the positive terminal of a battery 24 mounted on the motor car, whereas the negative output terminal 26 is grounded. The three-phase output of the alternator 4 is rectified by other three rectifier elements 28, 30 and 32 to supply a DC output from terminal 33 to a field terminal 38 of a regulator 36 through a field winding 34 of the alternator 4 and to one end of a parallel circuit including a resistor 42 and an indicator lamp 44 through an output terminal 40. The positive output terminal of the three-phase bridge rectifier circuit 20 is connected to the opposite terminal of the parallel circuit and an ignition coil, not shown, via an ignition switch 46. Casing 6 of alternator 4 is provided with a terminal 50 for connecting a capacitor 48 between the terminal 22 and the ground. The capacitor 48 functions to eliminate AC components from the DC output of the bridge rectifier circuit 20.

With reference now to FIGS. 2, 3 and 4 which show a construction of the semiconductor rectifier assembly there is provided an annular substrate 52 comprising a moulded resinous member 53 in which a conductive sheet provided with a circuit pattern (to be described later in detail) which is formed by stamping a thin metal sheet is moulded. The substrate 52 includes four legs 54, 55, 56 and 57 integrally formed on the surface thereof. A first sector shaped electrode or a negative fin 59 is secured to two legs 56 and 57 by means of two eyelets 58, which are used as the negative output terminal 26 of the semiconductor rectifier assembly, whereas a second sector shaped electrode or a positive fin 61 is secured to other two legs 54 and 55 by means of eyelets 60, which are insulated from fin 61 by means of an insulation spacer 62. A positive plate terminal 22 is caulked to fin 61. The positive plate terminal 22 is formed with a U-shaped notch 64 for receiving a projection 65 on fin 61. As the eyelets are clamped with the projection 65 received in notch 64, plate terminal 22 is prevented from turning about the eyelets. Further a capacitor terminal 50 is secured to positive fin 61 by means of an eyelet in the same manner as the positive plate terminal 22.

Each of the first and second plate electrode fins 59 and 61 is provided with three recesses 67 and 68. Cap shaped anode electrodes of the semiconductor rectifier elements 8, 10 and 12 are directly soldered to recesses 67 whereas cap shaped cathode electrodes of the semiconductor rectifier elements 14, 16 and 18 are directly soldered to recesses 68. Other lead wire electrodes of the rectifier elements 8 through 18 are passed through perforations of the substrate 52 to the opposite surface thereof and then soldered to predetermined portions of the circuit pattern conductor plate. Terminal plates 33 and 40 are caulked by eyelets to the substrate 52 so as to connect the terminal plates 33 and 40 to the desired portions of the circuit pattern conductor. These terminal plates 33 and 40 are secured to the bottom portion of shallow depressions 70 and 72 formed on the surface of the substrate 52 so as to prevent terminal plates 33 and 40 from moving along the side walls of the depressions 70 and 72.

Figure 5:
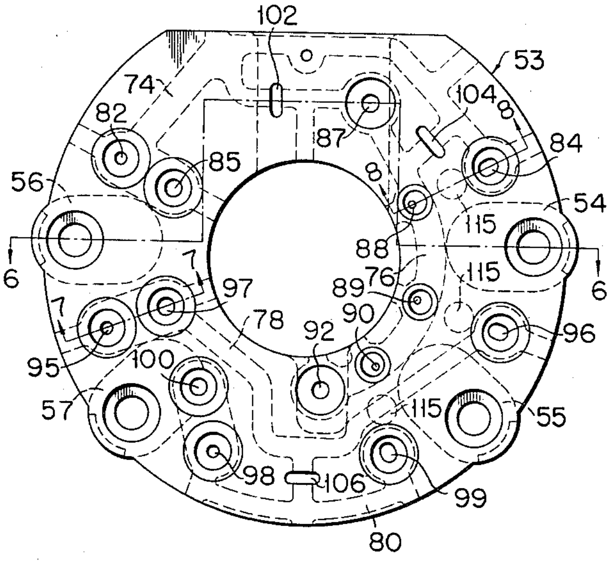
FIG. 5 is a plan view of the substrate shown in FIG. 2.

The annular substrate 52 comprises a moulded member 53 which is formed by moulding a mixture of an unsaturated polyester resin and a filler such as chips of glass fiber by injection moulding or transfer moulding and conductor sheets 74, 76, 78 and 80 with circuit patterns and moulded in the sheet moulded member 53. Each of the conductor sheets 74 to 80 is provided with a prescribed circuit pattern formed by subjecting a copper sheet or copper foil having a thickness of 200 to 500 microns, for example, to a press work or chemical etching treatment. The unsaturated polyester resin has a low percentage of shrinkage of less than 1/1000 and the moulded member 53 may be shaped to have accurate dimensions by injection moulding. The conductor sheet 74 is formed with openings 82 and 84 for receiving lead wires for the cathode electrode of the semiconductor rectifier element 8 and for the anode electrode of the semiconductor rectifier element 14 and an opening 85 for receiving one of AC input terminals of the three-phase alternator 4. The conductive sheet 76 is provided with an opening 87 for receiving an eyelet 86 (FIG. 2) for securing the terminal 33 to moulded member 53, openings 88, 89 and 90 for receiving cathode lead wires of the rectifier elements 28, 30 and 32 and an opening for receiving an elelet 91 (FIG. 2) adapted to securely fasten the output terminal 40 to the substrate 52. Furthermore, the conductor sheet 78 is provided with perforations 95 and 96 for receiving the cathode lead wire of the rectifier element 10 and the anode lead wire of the rectifier element 16, respectively, and an opening 97 for receiving the input terminals connected to the alternator 4. The conductor sheet 80 is provided with perforations 90 and 99 for receiving the cathode lead wire of the rectifier element 12 and the anode lead wire of the rectifier element 18, respectively and an opening 100 for receiving AC input terminals connected to the alternator 4. The conductor sheets 74, 78 and 80 are formed with a bridge rectifier pattern for rectifying the three-phase alternating current generated by alternator 4 whereas the conductor sheet 76 is formed with a circuit pattern for supplying current to the field winding of the alternator 4. Perforations 84, 96 and 99 are elliptical for receiving the anode lead wires of rectifier elements 14, 16 and 18 together with the anode lead wires of rectifier elements 28, 30 and 32. Perforations 102 and 104 shown in FIG. 5 are provided to isolate from each other conductor sheets 74 and 76. In the same manner, a perforation 106 is provided for isolating from each other conductive sheets 78 and 80. The conductive sheets 74, 76 and 78 are interconnected at portions corresponding to perforations 102, 104 and 106 when they are moulded in the moulded member 3, and are severed after moulding. The reason for interconnecting conductor sheets 74, 76 and 78 at the portions corresponding to perforations 102, 104 and 106 is to render easy to form these conductor sheets by a press work or to position them during assembling.

Figure 6:
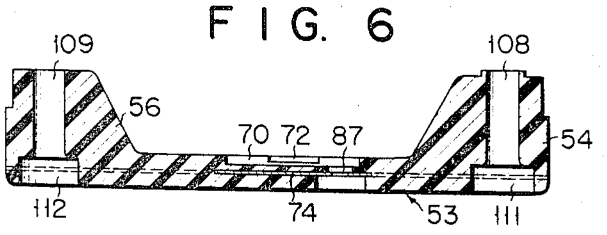
FIG. 6 shows a section taken along a line 6—6 in FIG. 5.
Figure 7:
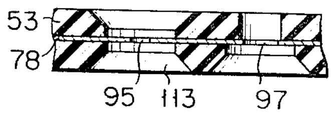
FIG. 7 shows a section taken along a line 7—7 in FIG. 5.

As best shown in FIG. 6, legs 54 and 56 are tapered for facilitating injection moulding. These legs 54 and 56 are provided with perforations 108 and 109 with enlarged recesses 111 and 112 for receiving eyelets 60 and 58, respectively. Opening 113 provided in moulding member 53 and corresponding to opening 95 shown in FIG. 5 has tapered portions at the opposite surfaces of the moulded member 53 as shown in FIG. 7. The purpose of these tapered portions is to permit ready access of the tip of the soldering iron to the joint between a lead wire inserted in opening 95 and the conductive sheet 78 and to prevent the heat of the soldering iron from melting the portion of the resinous moulded member 53 about opening 113. For the same reason, all openings in which the soldering operation is to be performed at the surface of the resinous moulded member 53 have tapered portions.

Figure 8:
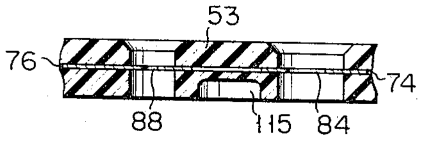
FIG. 8 is a sectional view taken along a line 8—8 in FIG. 5.

As shown in FIG. 8, a circular groove 115 is provided on the surface of the moulded member 53 at portions thereof between perforations 88, 89, 90 and perforations 84, 96, 99 adapted to receive lead wires of rectifier elements 28, 30 and 32. The body portions of the rectifier elements 28, 30 and 32 of which lead wires are soldered to portions between perforations 88 and 84, 89 and 96 and 90 and 99 respectively are fitted in the circular groove 115 and are cemented to the moulded member 53 by a bonding agent, an epoxy resin, for example.

Figure 9:
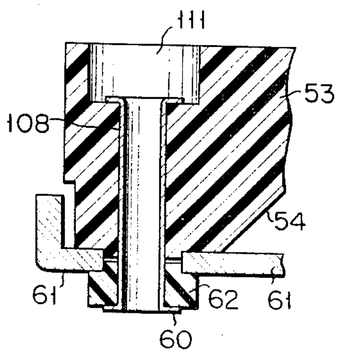
FIG. 9 is a sectional view taken along a line 9—9 in FIG. 2.
Figure 10:
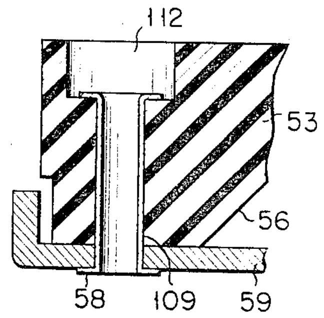
FIG. 10 shows a sectional view taken along a line 10—10 in FIG. 2.

As shown in FIG. 9, the positive fin 61 is caulked to the resinous moulded member 53 through an insulation spacer 62 by means of an eyelet 60 extending through perforation 108 of leg 54, the shoulder of the insulator spacer 62 being received in an opening of the fin 61. As shown in FIG. 10, the negative fin 59 is directly caulked to leg 56 by means of eyelet 58 extending through opening 112 of the leg 56.

Figure 11:
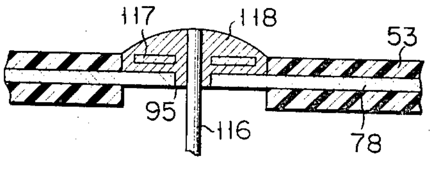
FIGS. 11 and 12 show different examples of soldered joints between a conductor plate and an electrode lead wire of the rectifier element.
Figure 12:
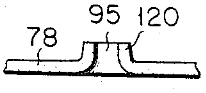

As shown in FIG. 11, lead wire 116 of the rectifier element 10 which is inserted through perforation 95 of conductor sheet 78 is soldered to the conductor sheet 78. To ensure positive soldering, a copper ring 117 may be slipped over lead wire 116 so as to solder ring 117, lead wire 116 and conductor sheet 78 into an integral structure. Alternatively, as shown in FIG. 12, a raised ridge 120 may be formed about perforation 95 of the conductor sheet 78.

As above described this invention provides an improved semiconductor assembly wherein the rectifier elements are firmly secured to the insulator substrate so that the assembly is highly resistant to shocks and vibrations. Moreover, the assembly is compact in construction, easy to fabricate and improved in resistance to heat and moisture.

What we claim is:

1. A semiconductor rectifier assembly for an automotive alternator, comprising:

an annular substrate including a moulded member of resinous material, conductive sheets formed into a circuit pattern, said sheets being entirely moulded within said moulded member, a plurality of legs integrally formed with said moulded member of resinous material on one surface thereof and means formed in said substrate for enabling passage of a plurality of electrode members therethrough for electrical connection of said electrode members with said circuit pattern;

a pair of sector shaped plate electrodes secured to said legs, said plate electrodes being electrically insulated from each other; and a plurality of semiconductor rectifier elements, each having a first electrode and a second electrode, the first electrodes thereof being electrically connected to selective plate electrodes and said second electrodes extending through said substrate and electrically connected to said circuit pattern.

2. A semiconductor rectifier assembly according to claim 1 wherein said resinous moulded member is made of unsaturated polyester resin having a percentage of shrinkage of less than 1/1000.

3. A semiconductor rectifier assembly according to claim 2 wherein said unsaturated polyester resin includes a filler of glass fibers.

4. A semiconductor rectifier assembly according to claim 1 wherein said conductive sheet is formed with a pattern of a full wave bridge rectifier circuit for rectifying three-phase alternating current.

5. A semiconductor rectifier assembly according to claim 1 wherein said conductive sheet is provided with a plurality of elliptical openings respectively accommodating two second electrodes of said rectifier elements.

6. A semiconductor rectifier assembly according to claim 4 wherein said conductive sheet is provided with a pattern of a circuit for supplying current to the field winding of said alternator.

7. A semiconductor rectifier assembly according to claim 1 wherein said substrate is provided with a plurality of perforations at portions corresponding to soldered joints between said second electrodes of said rectifier elements and said circuit pattern, the opposite ends of each of said perforations being tapered outwardly toward the surfaces of said substrate.

8. A semiconductor rectifier assembly according to claim 1 wherein said legs are slanted toward their outer ends.

9. A semiconductor rectifier assembly according to claim 1 wherein one of said sector shaped plate electrodes is secured directly to said legs by means of a first conductive clamping means which acts as the negative DC output terminal and the second sector shaped plate electrode is secured to said legs through an insulation spacer by means of a second conductive clamping means.

10. A semiconductor rectifier assembly according to claim 16 wherein each of said sector shaped plate electrodes is provided with a plurality of recesses and the cap electrodes of respective rectifier elements are received in said recesses.

11. A semiconductor rectifier assembly according to claim 1 wherein a plurality of terminals are provided on said sector shaped plate electrodes, each one of said terminals being formed with a notch adapted to receive a projection formed on said sector shaped plate electrode so as to prevent said terminals from turning with respect to said sector shaped plate electrodes.

12. A semiconductor rectifier assembly according to claim 7 wherein conductive rings are provided for the soldered joints between said second electrodes of said rectifier elements and said conductive sheet with said circuit pattern.

13. A semiconductor rectifier assembly according to claim 1 wherein said conductive sheet is provided with perforations each formed with a raised ridge, and the second electrodes of said rectifiers are passed through said perforations and soldered to said raised ridges.

14. A semiconductor rectifier assembly according to claim 1 wherein circular groove is formed in one surface of said moulded member and the body portions of said rectifier elements are received in said groove and cemented thereto by means of a bonding agent.

15. A semiconductor rectifier assembly according to claim 1 wherein said plurality of semiconductor rectifier elements includes a first group of six semiconductor rectifier elements constituting a full wave bridge rectifier circuit and a second group three semiconductor rectifier elements constituting a full wave rectifier circuit.

16. A semiconductor rectifier assembly according to claim 1 wherein said first electrodes of said rectifier elements are cap electrodes.

17. A semiconductor rectifier assembly according to claim 16 wherein said second electrodes of said rectifier elements are lead wires.

* * * * *